(12) United States Patent
Ball

(10) Patent No.: US 6,956,294 B2
(45) Date of Patent: Oct. 18, 2005

(54) APPARATUS FOR ROUTING DIE INTERCONNECTIONS USING INTERMEDIATE CONNECTION ELEMENTS SECURED TO THE DIE FACE

(75) Inventor: Michael B. Ball, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/526,814

(22) Filed: Mar. 16, 2000

(65) Prior Publication Data

US 2003/0057570 A1 Mar. 27, 2003

Related U.S. Application Data

(62) Division of application No. 08/800,841, filed on Feb. 14, 1997, now Pat. No. 6,097,098.

(51) Int. Cl.⁷ .............................................. H01L 29/40
(52) U.S. Cl. ..................................................... 257/786
(58) Field of Search ........................ 257/768, 734–740, 257/686, 786

(56) References Cited

U.S. PATENT DOCUMENTS

| | | | | |
|---|---|---|---|---|
| 4,712,129 A | * | 12/1987 | Orcutt .......................... | 357/84 |
| 5,088,190 A | * | 2/1992 | Malhi et al. ................... | 29/843 |
| 5,137,845 A | | 8/1992 | Lochon et al. | |
| 5,248,903 A | | 9/1993 | Heim | |
| 5,250,840 A | | 10/1993 | Oh et al. | |
| 5,255,156 A | | 10/1993 | Chang | |
| 5,291,062 A | * | 3/1994 | Higgins ....................... | 257/698 |
| 5,304,737 A | | 4/1994 | Kim | |
| 5,363,279 A | | 11/1994 | Cha | |
| 5,436,503 A | * | 7/1995 | Kunitomo et al. .......... | 257/737 |
| 5,441,917 A | | 8/1995 | Rostoker et al. | |
| 5,445,994 A | | 8/1995 | Gilton | |
| 5,455,460 A | | 10/1995 | Hongo et al. | |
| 5,498,767 A | | 3/1996 | Huddleston et al. | |
| 5,523,586 A | * | 6/1996 | Sakurai ........................ | 257/48 |
| 5,534,729 A | | 7/1996 | Russell | |
| 5,550,403 A | * | 8/1996 | Carichner .................... | 257/702 |
| 5,561,086 A | | 10/1996 | Rostoker | |
| 5,569,960 A | * | 10/1996 | Kumazawa et al. ......... | 257/738 |
| 5,583,376 A | * | 12/1996 | Sickler et al. ............... | 257/698 |
| 5,598,036 A | * | 1/1997 | Ho ............................... | 257/673 |
| 5,612,575 A | | 3/1997 | De Givry | |
| 5,616,931 A | | 4/1997 | Nakamura et al. | |
| 5,723,906 A | | 3/1998 | Rush | |
| 5,751,060 A | * | 5/1998 | Laine et al. ................. | 257/673 |
| 5,757,078 A | * | 5/1998 | Matsuda ...................... | 257/787 |
| 5,838,072 A | | 11/1998 | Li et al. | |
| 5,905,303 A | * | 5/1999 | Kata ............................ | 257/701 |
| 6,052,287 A | * | 4/2000 | Palmer ........................ | 257/774 |
| 6,225,692 B1 | * | 5/2001 | Hinds ........................... | 257/698 |
| 6,265,766 B1 | | 7/2001 | Moden | |
| 6,297,560 B1 | * | 10/2001 | Capote et al. ............... | 257/701 |
| 6,300,163 B1 | | 10/2001 | Akram | |
| 6,369,451 B2 | * | 4/2002 | Lin .............................. | 257/779 |
| 6,380,061 B1 | * | 4/2002 | Kobayashi et al. .......... | 438/613 |

FOREIGN PATENT DOCUMENTS

| | | |
|---|---|---|
| DE | 195 17 367 A1 | 11/1995 |
| EP | 2117564 A  * | 10/1983 |

* cited by examiner

*Primary Examiner*—Hoai Pham
*Assistant Examiner*—Nathan W. Ha
(74) *Attorney, Agent, or Firm*—TraskBritt

(57) ABSTRACT

A semiconductor device, such as an integrated circuit die, includes a plurality of bond pads on an active surface thereof electrically connected to internal circuitry of the semiconductor device, and a plurality of jumper pads on the active surface which are electrically isolated from internal circuitry of the die. The jumper pads effectively provide stepping stones for wire bonds to be made across the active surface between bond pads. The jumper pads may be formed directly on the semiconductor device or on a nonconductive support structure that is attached to the semiconductor device.

17 Claims, 11 Drawing Sheets

APPARATUS FOR ROUTING DIE INTERCONNECTIONS USING INTERMEDIATE CONNECTION ELEMENTS SECURED TO THE DIE FACE

CROSS-REFERENCE TO RELATED APPLICATION

This application is a divisional of application Ser. No. 08/800,841, filed Feb. 14, 1997, now U.S. Pat. No. 6,097,098, issued Aug. 1, 2000.

BACKGROUND OF THE INVENTION

1. Field of the Invention

This invention relates generally to a method and apparatus for routing die interconnections on a semiconductor die and, more specifically, to a method and apparatus for routing die interconnections using intermediate connection elements secured to a major surface of the die.

2. State of the Art

A typical integrated circuit (IC) or semiconductor die includes external connection points termed "bond pads" that are in electrical communication with integrated circuits formed in or on the active surface of the die. The bond pads are used to provide electrical connection between the integrated circuits and external devices, such as lead frames or printed circuit boards. The bond pads also provide sites for electrical testing of the die, typically by contact with probes, which send and receive signals to and from the die to evaluate the functionality of the die.

In a conventional die/lead frame assembly, the semiconductor die is attached to a die paddle of a lead frame using an adhesive or tape. The bond pads formed on the face of the die are typically electrically and mechanically attached to lead fingers terminating adjacent the periphery of the die using thin bonding wires of gold, aluminum or other metals or alloys. Other types of lead frames, such as so-called "leads over chip" (LOC) or "leads under chip" (LUC), dispense with the die paddle and support the die from portions of the lead fingers themselves.

Wire bonding is typically a process through which some or all of the bond pads formed on the face of the die are connected to the lead fingers or buses of a lead frame by thin bonding wires. The bonding wires comprise the electrical bridge between the bond pads and the leads of the packaged integrated circuit. A wire bonding apparatus bonds the bonding wires to the bond pads and to the lead fingers, typically using heat and pressure, as well as ultrasonic vibration in some instances. Following wire bonding, the lead frame and die are typically encapsulated in a plastic (particle-filled polymer) or packaged in a preformed ceramic or metal package. After encapsulation, the lead fingers are then trimmed and usually bent to form external leads of a completed semiconductor package in what is termed a "trim and form" operation.

Another wire bonding application may include chip-on-board (COB), where the back-side surface of a bare IC die is directly mounted on the surface of a substantially rigid printed circuit board (PCB) or other carrier substrate, and bond pads on the front-side or active surface of the bare die are then wire bonded to wire bondable trace pads or terminals on the surface of the PCB to interconnect circuitry in the die with external circuitry through conductive traces on the PCB. Likewise, wire bondable traces may be formed from a metal film carried on a flexible polyimide or other dielectric film or sheet similar to those employed in so-called TAB (tape automated bonding) lead frame structures. A die may be back-mounted on the flex circuit and the traces wire bonded to bond pads on the surface of the die.

A typical die bond pad is formed as a rectangle or square typically having an area of less than $10^4$ $\mu m^2$ and framed or bounded by a passivation layer on the face of the die. Bond pads are typically formed from a conductive metal such as aluminum and electrically connected to an underlying integrated circuit formed in or on the die. Usually a barrier layer and a polysilicon layer separate the bonding pad from an oxide layer of a silicon substrate in which the active semiconductor devices are formed. A passivation layer formed of a dielectric material (silicon dioxide, silicon nitride, polyimide, BPSG, etc.) or as a sandwich of different materials (e.g., silicon dioxide/silicon) covers the oxide layer, and the bond pad is embedded in the passivation layer. Such bond pads may be located generally along the peripheral edges of the die, inset from the edges a desired distance, or in one or more center rows. These bond pads are then typically wire bonded to a lead frame, thermocompression bonded to an overlying TAB tape or flip-chip bonded (with appropriate prior "bumping" of the bond pads) to a printed circuit board.

It is often desirable to interconnect various bond pads on a single semiconductor die in order to alter the input and/or output functionality of the die, such as when it is necessary to "wire around" defective portions of a die which is only partially functional. For example, a 16 megabit DRAM memory die may only demonstrate 11 megabits of functional memory under electrical testing and burn-in. Alternatively, it may be desirable for a die having a given input/output (bond pad) configuration to "look" to a particular lead frame or carrier substrate as if it were configured differently so that the die could be used with a lead frame for which it was not originally intended. Such "wire around" functions, where possible, are typically accomplished by interconnecting bond pads on the die through external circuitry in printed circuit boards or other carrier substrates to which the die is mounted. Where the desired input and/or output functionality configuration varies from die to die, a separately configured printed circuit board or other carrier substrate must be provided for each desired input and/or output functional configuration. Thus, it would be desirable to provide a relatively easy way of interconnecting selected bond pads on a single integrated circuit die without requiring the use of external circuitry in printed circuit boards and other carrier substrates.

SUMMARY OF THE INVENTION

Accordingly, a semiconductor die according to the present invention is comprised of a die bearing integrated circuits. Such integrated circuits may comprise a memory device, microprocessor, or any other semiconductor device or functional combination of devices. In a preferred embodiment, the active surface of the die (i.e., the surface of the die having bond pads thereon and bearing the integrated circuits) includes at least one electrically isolated intermediate connection element or wire-bondable jumper pad attached thereto, each bondable jumper pad being electrically isolated from external circuitry and from circuitry of the die, but for wire bonds extending to and/or from the bondable jumper pad. That is, each bondable jumper pad is not directly electrically connected to internal circuitry of the die, unlike the bond pads, but provides a "stepping stone" for wire bonds between bond pads of the die or between a bond pad and a conductor external to the die. Thus, a relatively short wire bond can be formed from a bond pad to the jumper pad and another relatively short wire bond formed from the jumper pad to another bond pad (or external conductor) forming an electrical connection between the two bond pads (or bond pad and external conductor).

In another preferred embodiment, a plurality of jumper pads is provided over the active surface of the die, providing various serial jump points for a plurality of wire bonds to be formed in series between a plurality of bond pads. Where the semiconductor die has bond pads located about a peripheral edge of the active surface, a grid or array of jumper pads may be provided proximate the center of the active surface and at least partially bounded by the peripheral bond pads.

In yet another preferred embodiment, the semiconductor device is of the aforementioned LOC configuration and includes a lead frame having lead fingers and/or bus bars that extend over the active surface of the die. In addition, a plurality of jumper pads is provided on the active surface so that wire bonds can be made from bond pads to jumper pads to bus bar to jumper pad to bond pad to lead finger, or any combination thereof, depending on the desired input/output (I/O) configuration of the die.

Preferably, the jumper pads are comprised of a conductive material, such as metals (e.g., aluminum or gold) or alloys thereof.

In a preferred embodiment, the jumper pads are silk-screened onto the active surface of the die. The jumper pads may also be electrolessly plated, electroplated, or electrochemically deposited, printed, sprayed (through a mesh), adhesively attached or otherwise formed onto the active surface of the die.

In yet another preferred embodiment, the jumper pads are formed in a grid or array on one side of an adhesive tape or film. Such a tape or film could then be cut to size to fit the specific die. The tape could be attached to the die by thermosetting, application of pressure, or other methods, depending on the type of tape and adhesive employed.

In another preferred embodiment, the jumper pads may be formed over a segment of insulating or dielectric material, such as a nonconductive film or coating, that is applied to the active surface of the die. The insulating material protects internal circuitry near the active surface from any interference or shorting that may be otherwise generated by the presence of the jumper pad or connections to the jumper pads.

In yet another preferred embodiment, a jumper pad adapter is attached to the active surface of the die by an adhesive. The adhesive may be a pressure sensitive adhesive, a thermosetting adhesive or any other suitable adhesives known in the art. The jumper pad adapter includes a plurality of conductive lines extending through the adapter from the lower surface thereof which provides electrical contact between the bond pads or conductive bumps formed on the die and contact pads formed on the top surface of the jumper pad adapter. Thus, jumper pads are formed on the upper surface of the adapter rather than on the active surface of the die, and the contact pads and jumper pads on the adapter lie in substantially the same plane. Accordingly, all wire bonds between jumper pads and contact pads can be formed in the same horizontal plane relative to the top surface of the jumper pad adapter.

Preferably, the jumper pad adapter includes access holes that extend through the adapter to allow access for wire bonds to be made to bond pads on the active surface of the die that would otherwise be covered by the adapter.

In another preferred embodiment of the jumper pad adapter, the adapter includes internal and/or external conductive paths which can route signals between jumper pads and to and between bond pads on the active surface of the die.

In yet another preferred embodiment, an adapter, which converts a die having peripherally mounted bond pads to a flip-chip array connection configuration, includes first contact pads electrically connected to the bond pads of the die, second contact pads exposed on the top of the adapter and in horizontally-offset locations from the bond pads, and conductors extending to and between the first and second contact pads. The second contact pads may be bumped so that the adapter, and thus the die, can be flip-chip bonded to a PCB or other carrier substrate.

DETAILED DESCRIPTION OF THE INVENTION

Figure 1A:
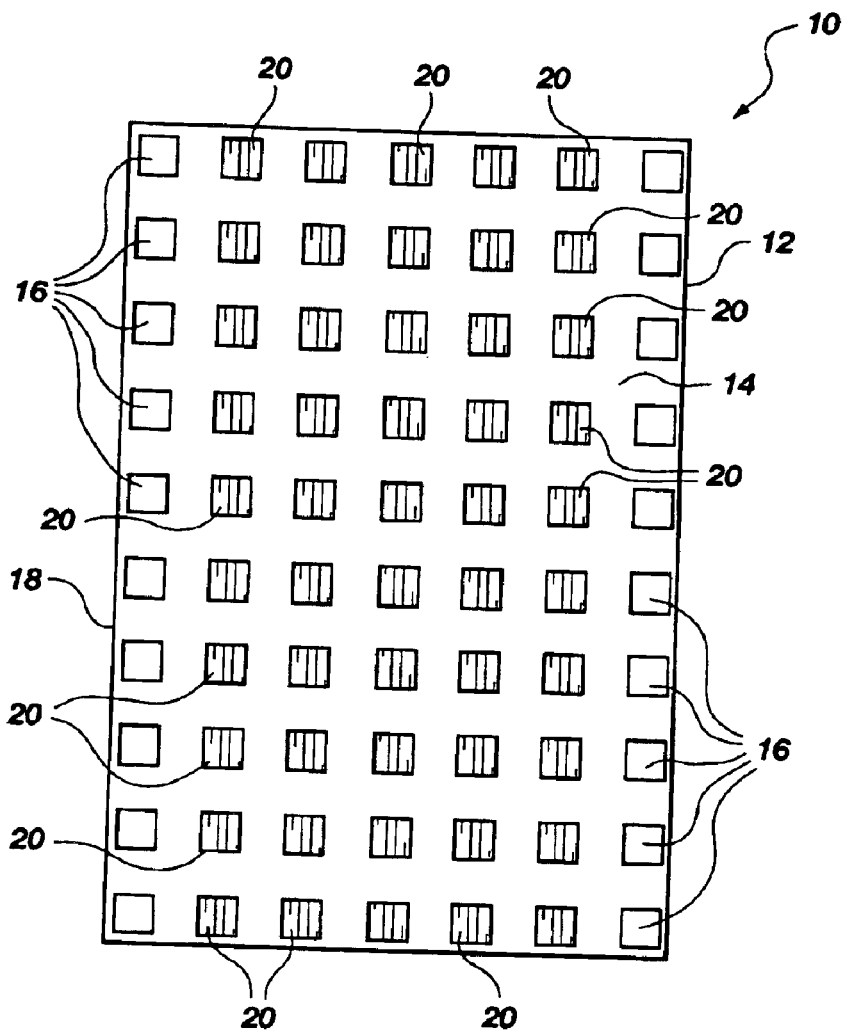
FIGS. 1A and 1B are top and side views, respectively, of a first embodiment of a semiconductor device in accordance with the present invention.
Figure 1B:
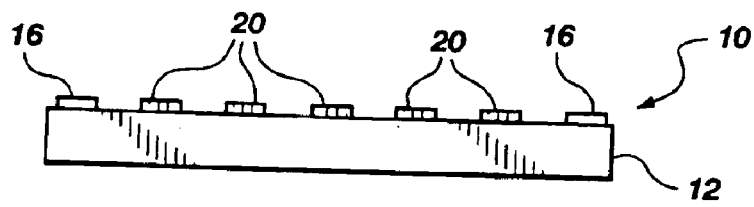

As illustrated in FIGS. 1A and 1B, a preferred embodiment of a semiconductor device 10 of the present invention includes a die 12 of generally rectangular configuration. The die 12 has an active surface 14 carrying a plurality of bond pads 16 proximate its perimeter 18 and a plurality of jumper pads 20, distinguished by surface shading in the drawing and disposed between the rows of peripheral bond pads 16. The bond pads 16 are formed as an integral part of the die 12, making contact with and providing an external contact for internal circuitry (not shown) contained within the die 12, as is known in the art.

Figure 1C:
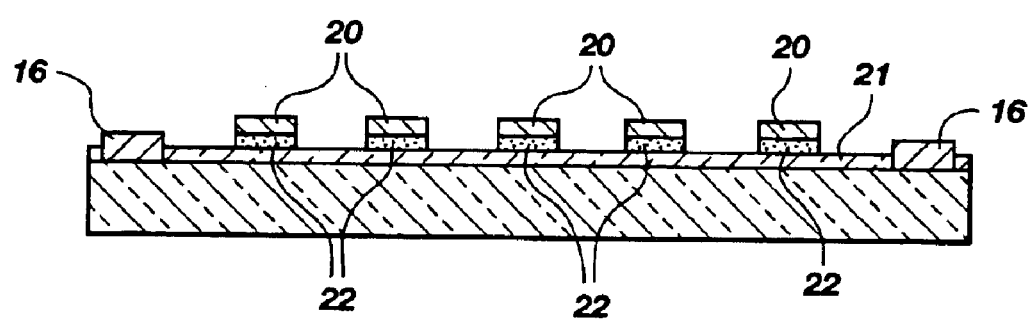
FIG. 1C is a cross-sectional side view of a second embodiment of a semiconductor device illustrated in FIG. 1A.

As indicated, the bond pads 16 are typically formed in the active surface 14 of the die 12 and thus extend a distance into the active surface 14 through a passivation layer 21 (illustrated in FIG. 1C) to make electrical contact with the internal circuitry of the die 12. The jumper pads 20, on the other hand, are formed on the active surface 14 but are electrically isolated from the internal circuitry of the die 12. Moreover, the jumper pads 20 are preferably formed from a conductive material such as a metal, metal alloy, or any other suitable material known in the art to which a wire bond can be attached. The jumper pads 20 may be silk-screened, printed, sprayed through a patterned mesh, electrochemically deposited, or electroplated, electrolessly plated or otherwise attached to the active surface. Similarly, as shown in FIG. 1C, the jumper pads 20 may be preformed, and each adhesively attached to the active surface 14 with an adhesive 22, such as an epoxy or other similar material known in the art. The adhesive 22 is preferably insulative, although it does not have to be if the passivation layer 21 possesses sufficiently robust dielectric characteristics.

Figure 2A:
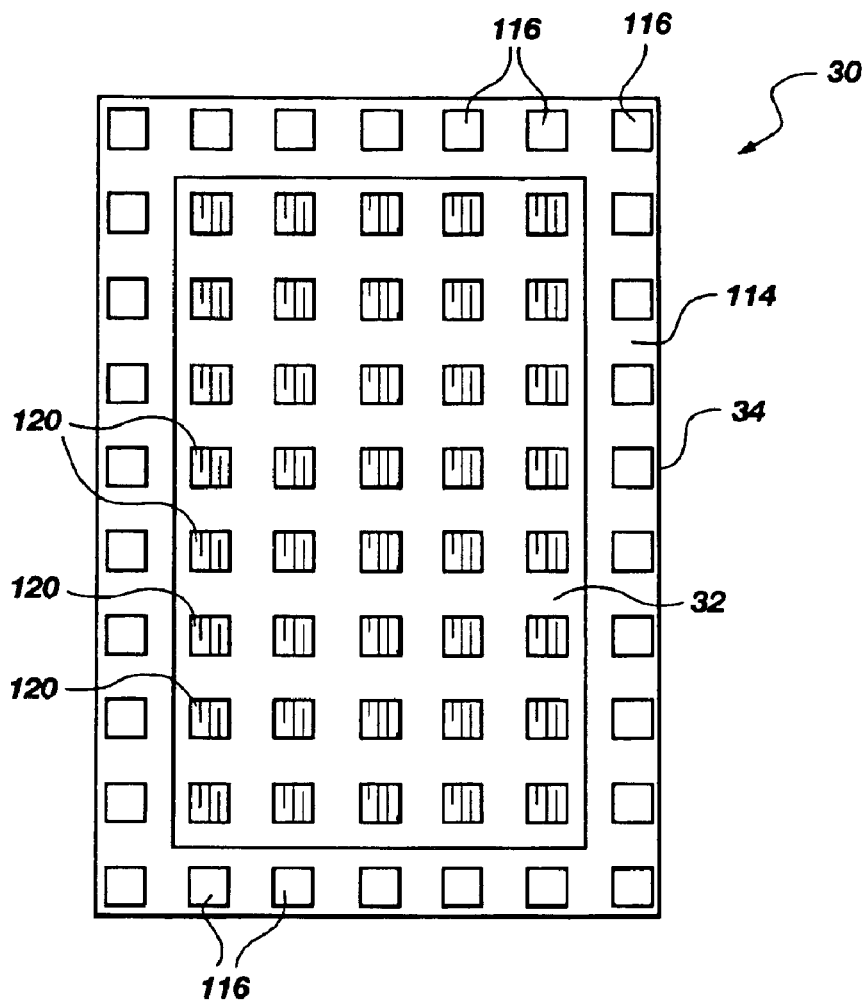
FIGS. 2A and 2B are top and side views, respectively, of a third embodiment of a semiconductor device in accordance with the present invention.
Figure 2B:
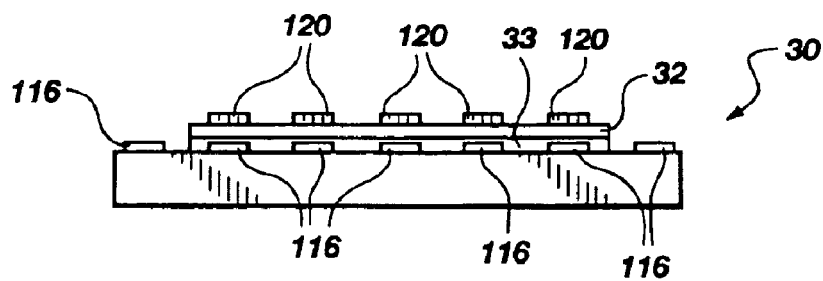

In FIGS. 2A and 2B, a semiconductor device 30 having peripheral bond pads 116 includes a sheet-like insulating layer, film or tape segment 32 disposed between an active surface 114 of die 34 and jumper pads 120. The jumper pads 120 are thus formed in or on the tape 32 and the tape 32 is adhesively attached to the active surface 114 of a die 34. The tape 32 may be an adhesive-type tape or bear a thermosetting adhesive 33, one preferred tape being a polyimide film as sold under the trademark Kapton®, or other suitable tapes, tape-like films or sheet structures adhesively attached to active surface 114 using adhesive techniques known in the art. Preferably, the tape 32 is nonconductive and thus insulates the active surface 114 of the die 34 from electrical signals that may be passed through the jumper pads 120. The thickness of tape 32 has been exaggerated for clarity but may, in fact, be extremely thin, only of sufficient structural integrity to maintain its form during handling and application to the die.

Figure 3:
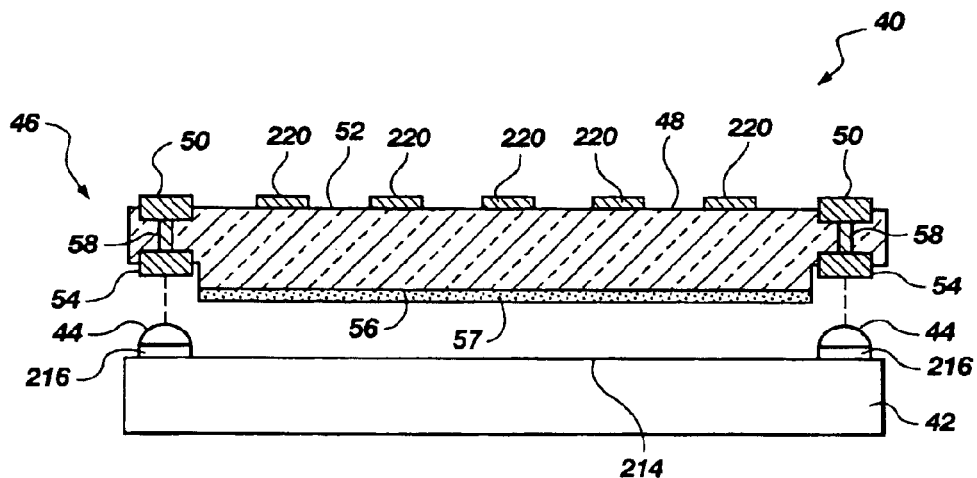
FIG. 3 is an exploded cross-sectional side view of a fourth embodiment of a semiconductor device in accordance with the present invention.
Figure 3A:
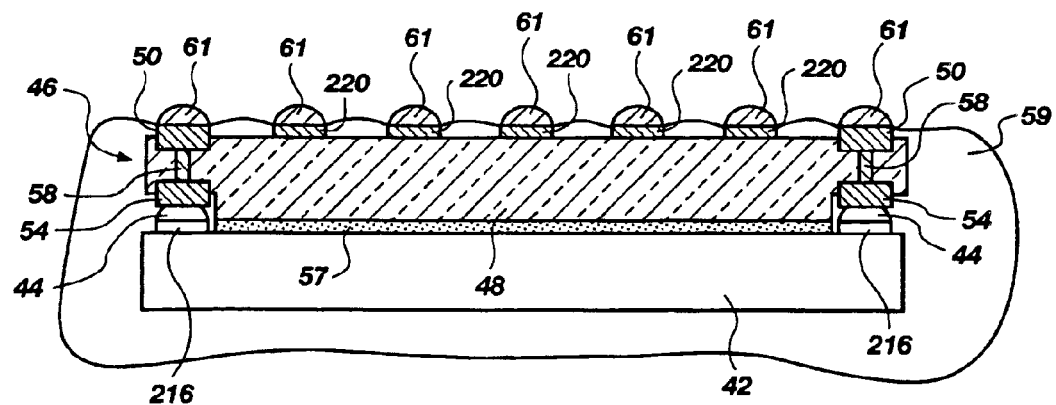
FIG. 3A is a cross-sectional side view of the semiconductor device shown in FIG. 3 after assembly and application of a protective coating.

FIG. 3 illustrates yet another preferred embodiment of a semiconductor device 40 according to the present invention in which an adapter 46 converts a peripherally bond padded semiconductor die 42 to a device 40 bearing jumper pads 220. The semiconductor die 42 includes bond pads 216 which have been "bumped"; that is, balls or bumps 44 of gold, solder or conductive adhesive have been attached thereto. An adapter 46 configured to mate with the active surface 214 and bond pads 216 of the die 42 is comprised of a support structure 48, which may be formed of a sheet-like structure, such as Kapton® or other tape as used in tape automated bonding, or a more rigid structure formed from ceramic, silicon, FR-4 or other materials known in the art. Preferably, the adapter 46 is formed from a material having a coefficient of thermal expansion (GTE) substantially matching the GTE of the die 42. The adapter 46 includes a plurality of first contact pads 50 on a top surface 52 thereof and a plurality of second contact pads 54 proximate a bottom surface 56 thereof. The first contact pads 50 are electrically connected to the second contact pads 54 by conductive contacts or vias 58 that extend to and between the first and second contact pads 50 and 54, respectively, and are contained within the support structure 48. The second contact pads 54 are arranged to match the arrangement of bumped bond pads 216. Thus, when the adapter 46 and die 42 are brought together and mutually secured by adhesive 57, the second contact pads 54 mate with the bumped pads 216. As further illustrated in FIG. 3A, the assembled semiconductor device 40 may be dipped or coated with a protective layer 59 of, for example, epoxy or silicon gel to protect and insulate the adapter 46 and the die 42, and the first contact pads 50 may be bumped so that the conductive bumps 61 extend above the protective layer 59 for flip-chip connection to a carrier substrate. In such an arrangement, short conductive traces formed on the carrier substrate would extend between jumper pads 220 and first contact pads 50 to be connected, between a series of jumper pads 220, between a contact pad 50 and an external circuit trace, etc. Alternatively, and as more fully described with respect to FIG. 6, rerouting circuitry may be carried within adapter 46 to reroute a bond pad 216 to a new location of a contact pad 50. It is also an option to employ adapter 46 only as an interposer substrate to provide for flip-chip connection of die 42 to a carrier substrate, omitting jumper pads 220 or any sort of bond pad rerouting capability.

Figure 4:
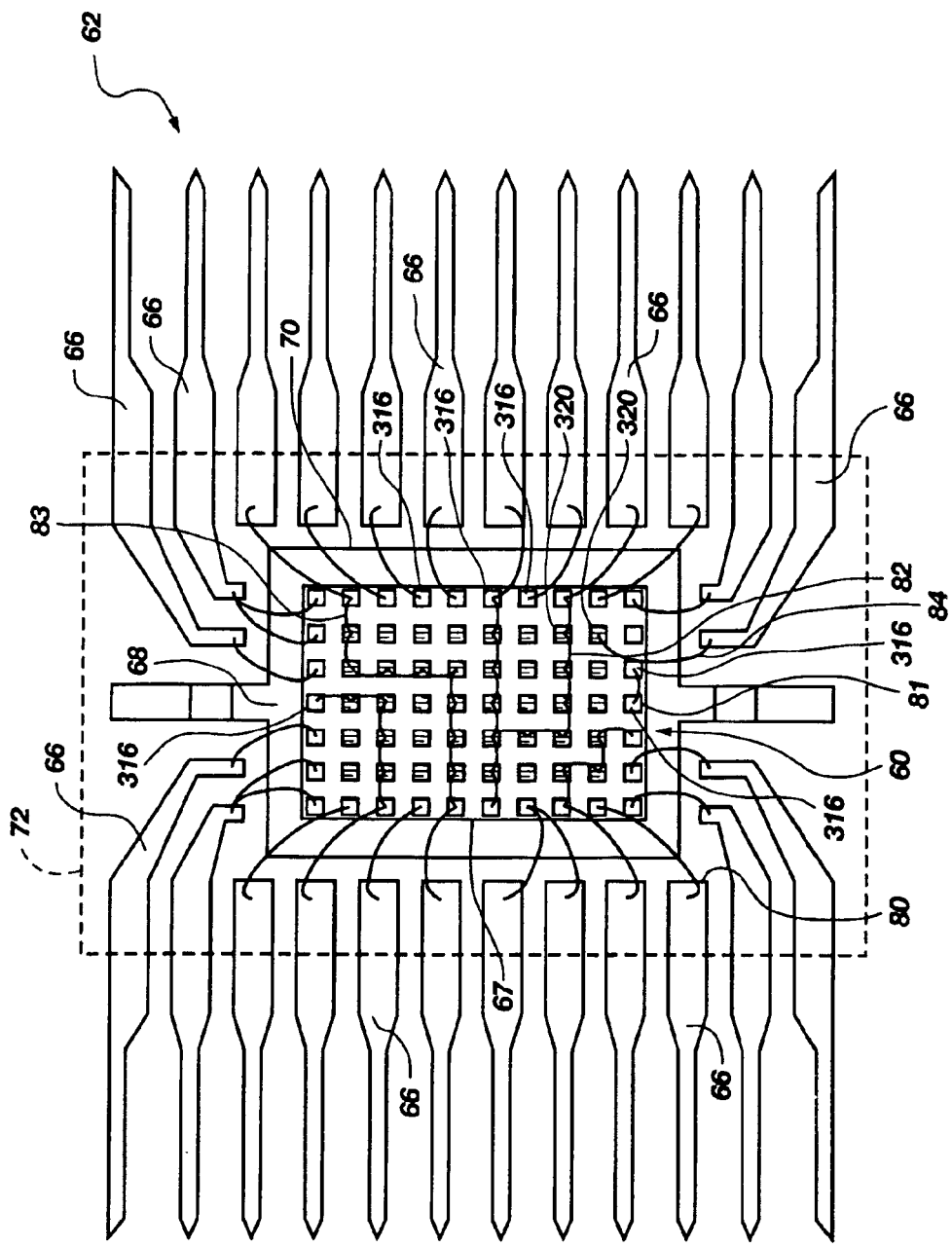
FIG. 4 is a top view of a fifth embodiment of a semiconductor device wire bonded to a lead frame in accordance with the present invention.

As shown in FIG. 4, a semiconductor device 60, such as those illustrated in FIGS. 1A, 1B, 1C, 2A, 2B and 3, can be mounted to a conventional lead frame 62 as is known in the art. The lead frame 62 includes a plurality of lead fingers 66 extending outwardly from proximate the perimeter 67 of a die 70 and a die paddle 68 which supports the die 70 relative to the lead fingers 66. The lead fingers 66 form leads for a packaged semiconductor device (the outline of which is indicated by dashed line 72) after transfer-molded polymer encapsulation of the die 70 and lead frame 62 as is known in the art.

Conventionally, any connections to be made between bond pads 316, other than those made with circuitry internal to the die 70, are made through external circuitry, such as that contained in a printed circuit board to which the semiconductor device 60 is connected. This approach, however, requires a permanently configured product, namely the printed circuit board or other carrier substrate. The semiconductor device 60 of the present invention provides for flexibility in input/output (I/O) configurations of the device 60 that can be changed from device to device in the manufacturing process.

As illustrated, wire bonds 80, 81, 82, 83 and 84 can be formed: between bond pad 316 and lead finger 66; between adjacent or proximate bond pads 316; between adjacent or proximate jumper pads 320; between bond pad 316 and jumper pad 320; or between jumper pad 320 and lead finger 66. The termination points of wire bonds 80, 81, 82, 83 and 84 can be of ball, wedge, or other configuration as is known in the art, and formed with a conventional wire bonding machine. Accordingly, a large number of I/O alternative configurations can be achieved for any semiconductor device, depending on the number and layout of jumper pads 320 and configuration of wire bonds.

It is contemplated that any semiconductor die having bond pads thereon can benefit from the jumper pads in accordance with the present invention. In addition, such a die can be combined with any lead frame known in the art, such as a leads-over-chip (LOC) lead frame, or a hybrid frame, such as a lead frame 90 illustrated in FIG. 5A, that includes lead fingers or bus bars 92, 93, 94, and 95 extending over the active surface 414 of a die 96. Wire bonds 98 can thus be made between jumper pads 420 and lead fingers or bus bars 92, 93, 94 and 95 as well as those combinations described with reference to FIG. 4.

Figure 5A:
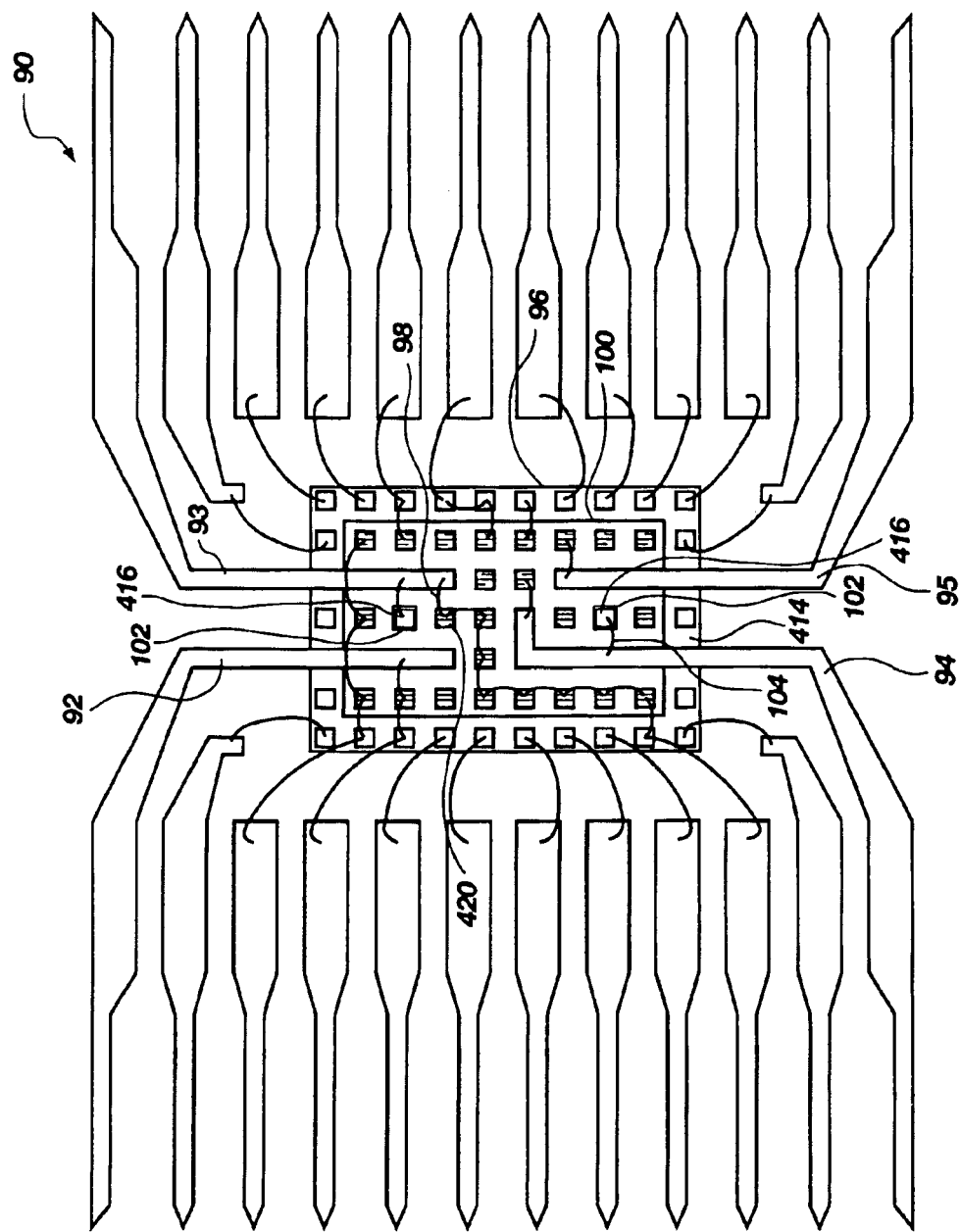
FIG. 5A is a top view of a sixth embodiment of a semiconductor device wire bonded to a lead frame in accordance with the present invention.
Figure 5B:
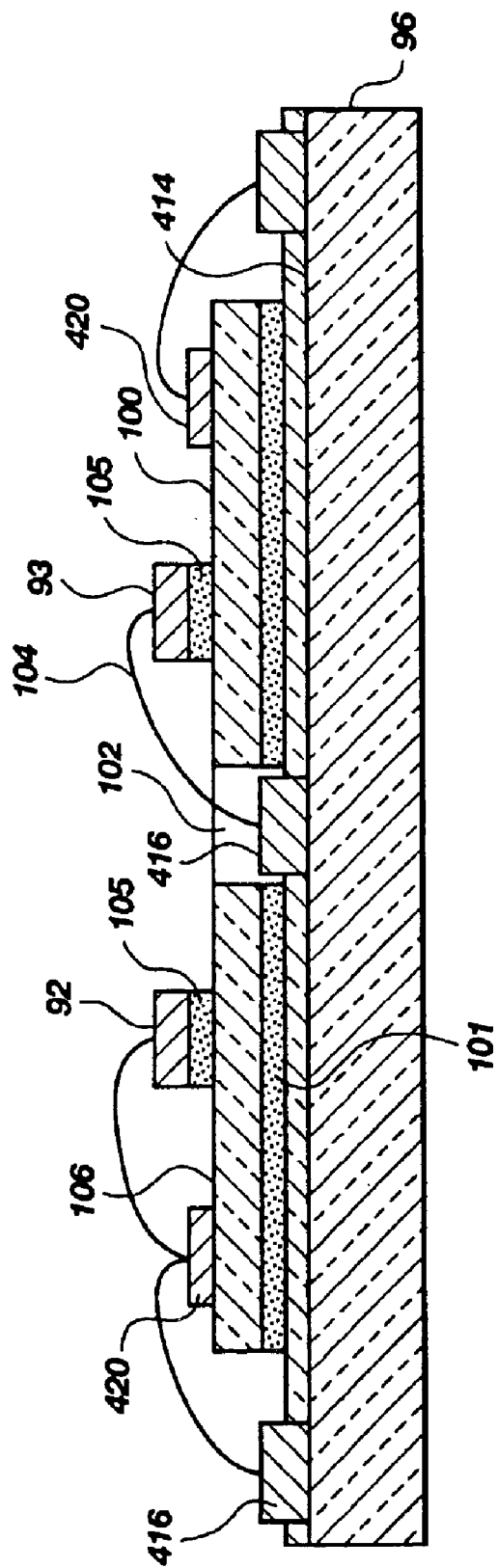
FIG. 5B is a cross-sectional side view of the embodiment illustrated in FIG. 5A.

As illustrated in FIGS. 5A and 5B, a tape-like structure 100 adhesively attached to the active surface 414 and which supports the jumper pads 420 above the active surface 414 of the die 96 is provided with through holes or windows 102 to expose bond pads 416 located on the active surface 414 that would otherwise be covered by the sheet, film or tape-like structure 100. A wire bond 104 can thus be made between an exposed bond pad 416 and bus bar 93. Preferably, the bus bars 92, 93, 94, and 95 are attached with an adhesive 105 to the top surface 106 of the tape-like structure 100, with the sheet, film or tape-like structure likewise being adhesively attached as at 101 to the active surface 414 of the die 96. Thus, the bus bars 92, 93, 94, and 95 effectively support the die 96 relative to the rest of the lead frame 90.

Figure 6:
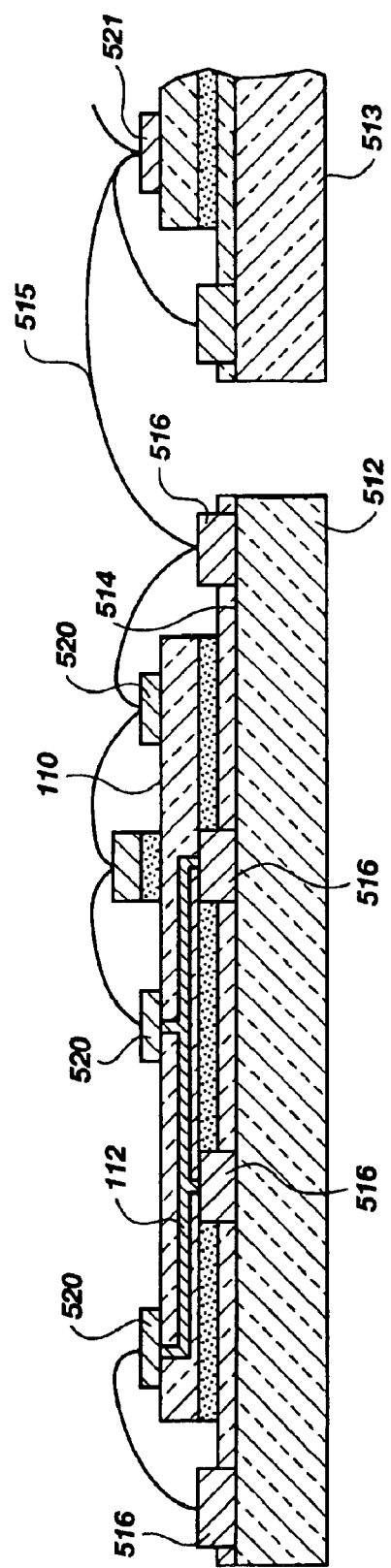
FIG. 6 is a cross-sectional side view of a seventh embodiment of a semiconductor device in accordance with the present invention.

In another preferred embodiment of the present invention shown in FIG. 6, a tape-like structure 110 may include its own internal circuitry or conductive lines 112 that connect jumper pads 520 to other jumper pads 520 and/or jumper pads 520 to bond pads 516 which are located on an active surface 514 of a die 512, and which are covered by the tape-like structure 110. It is also contemplated, as further illustrated, that the present invention has equal utility for multiple dice 512 and 513 in the same package (such as in a multi-chip module, or MCM) where wire bonds 515 make die-to-die interconnections between jumper pads 521 and/or bond pad 516 between the dice 512 and 513, as well as those combinations described with reference to single die 70 of FIG. 4.

Figure 6A:
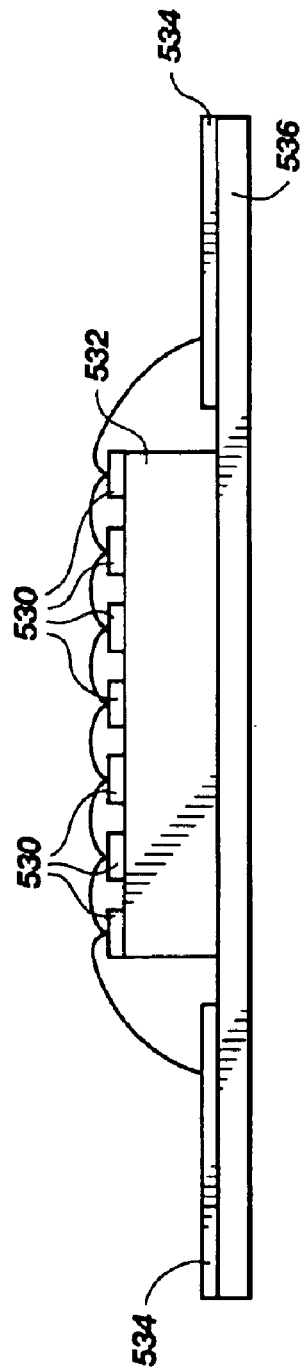
FIG. 6A is a cross-sectional side view of an eighth embodiment of a semiconductor device in accordance with the present invention.
Figure 6B:
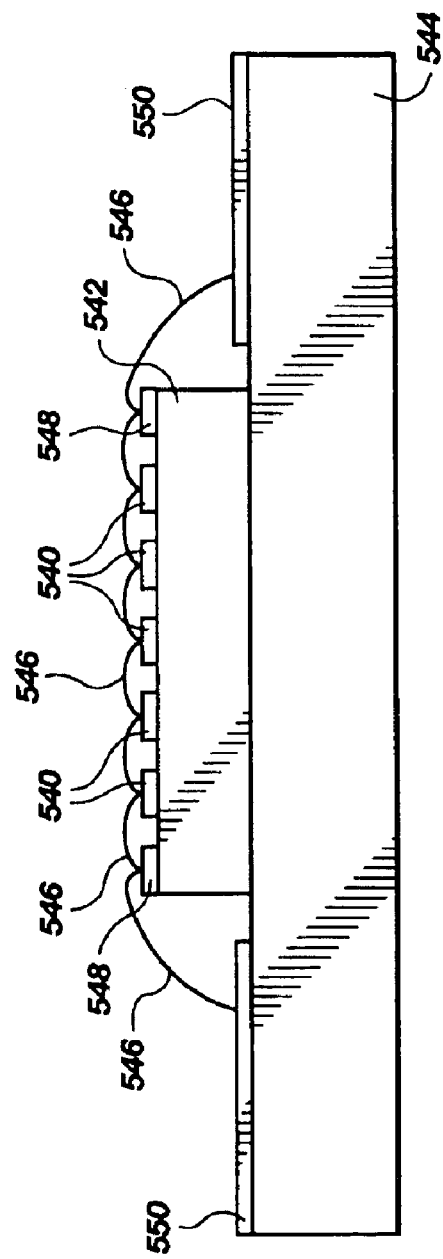
FIG. 6B is a cross-sectional side view of a ninth embodiment of a semiconductor device in accordance with the present invention.

It is contemplated that jumper pads in accordance with the present invention may also be advantageous to any situation where wire bonds are formed between a semiconductor die and external circuitry. For example, as illustrated in FIG. 6A, jumper pads 530 may be employed on a die 532 that is wire bonded to the leads 534 of a flex circuit 536. Likewise, as shown in FIG. 6B, jumper pads 540 may be formed on a die 542 that is directly mounted on a rigid PCB or carrier substrate 544 in a COB configuration with wire bonds 546 that are formed between jumper pads 540 and bond pads 548 and traces 550 on the PCB 544.

Those skilled in the art will appreciate that semiconductor devices according to the present invention may comprise an integrated circuit die employed for storing or processing digital information, including, for example, a Dynamic Random Access Memory (DRAM) integrated circuit die, a Static Random Access Memory (SRAM) integrated circuit die, a Synchronous Graphics Random Access Memory (SGRAM) integrated circuit die, a Programmable Read-Only Memory (PROM) integrated circuit die, an Electrically Erasable PROM (EEPROM) integrated circuit die, a flash memory die and a microprocessor die, and that the present invention includes such devices within its scope. In addition, it will be understood that the shape, size, and configuration of bond pads, jumper pads, dice, and lead frames may be varied without departing from the scope of the invention and appended claims. For example, the jumper pads may be round, oblong, hemispherical or variously shaped and sized so long as the jumper pads provide enough surface area to accept attachment of one or more wire bonds thereto. In addition, the bond pads may be positioned at any location on the active surface of the die.

Figure 7:
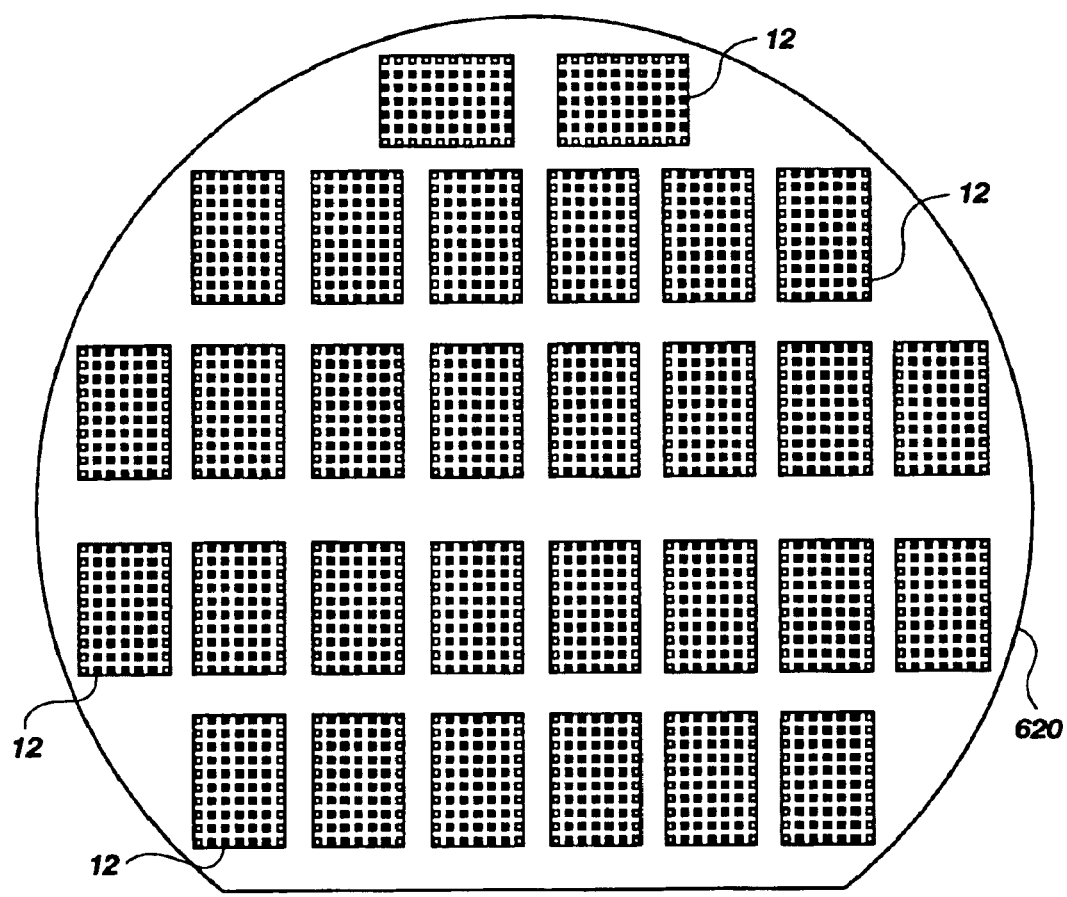
FIG. 7 is a top view of a semiconductor wafer comprising a plurality of the semiconductor device illustrated in FIG. 1A.
Figure 8:
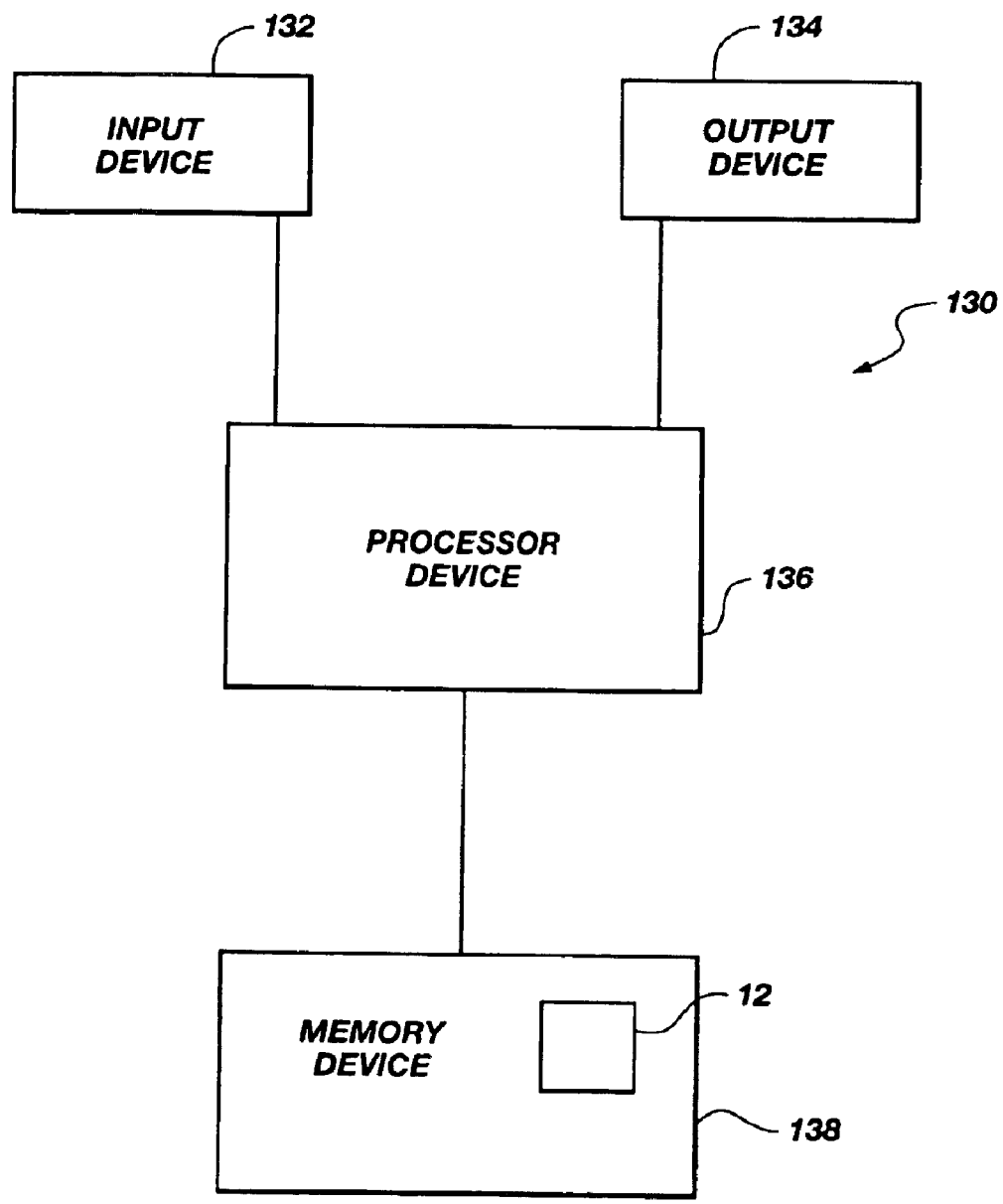
FIG. 8 is a block diagram of an electronic system incorporating the semiconductor device of FIG. 1A.

As shown in FIG. 7, a semiconductor wafer 620 incorporates a plurality of integrated circuit dice 12 (shown in increased scale and reduced numbers relative to the wafer 620) of FIGS. 1A and 1B. Also, as shown in FIG. 8, an electronic system 130 includes an input device 132 and an output device 134 coupled to a processor device 136 which, in turn, is coupled to a memory device 138 incorporating the exemplary integrated circuit die 12 of FIGS. 1A and 1B.

Accordingly, the claims appended hereto are written to encompass all semiconductor devices including those mentioned. Those skilled in the art will also appreciate that various combinations and obvious modifications of the preferred embodiments may be made without departing from the spirit of this invention and the scope of the accompanying claims.

What is claimed is:

1. An apparatus for routing interconnections among bond pads on a semiconductor die, comprising:

a sheet-like, nonconductive structure having a first surface, a second, opposing surface for attachment to the semiconductor die and a peripheral edge, wherein a first zone is defined on the first surface adjacent the peripheral edge and a second zone is defined on the first surface, the second zone being located interiorly of, and circumscribed by, the first zone;

a first plurality of electrically conductive discrete pads disposed in the first zone; and a second plurality of electrically conductive discrete pads attached to the first surface, the second plurality of electrically conductive discrete pads each having an electrical connect portion and an electrically isolated portion comprising a portion facing the first surface and a periphery defined thereabout, wherein each of the second plurality of electrically conductive discrete cads is located within the second zone.

2. The apparatus of claim 1, further comprising at least one conductor extending between at least one of the first plurality of electrically conductive discrete pads and at least one of the second plurality of electrically conductive discrete pads, the at least one conductor including at least a portion external to the sheet-like, nonconductive structure.

3. The apparatus of claim 1, further comprising at least one conductor extending from at least one bond pad of the die to at least one of the plurality of electrically conductive discrete pads.

4. The apparatus of claim 1, wherein the sheet-like, nonconductive structure is comprised of a dielectric film or sheet.

5. The apparatus of claim 1, further comprising at least one conductor extending between at least one of the first plurality of electrically conductive discrete pads and at least one other of the first plurality of electrically conductive discrete pads.

6. The apparatus of claim 1, further comprising at least one conductor extending between at least one of the second plurality of electrically conductive discrete pads and at least one other of the second plurality of electrically conductive discrete pads.

7. A semiconductor device, comprising:

a die including a plurality of bond pads disposed on a surface thereof and a plurality of conductive bumps, each being disposed on one of the plurality of bond pads;

an adapter adhered to the surface of the die, the adapter having a first plurality of discrete electrical contacts on a first surface thereof, each of the first plurality of discrete electrical contacts being contiguous with one of the plurality of conductive bumps, and a second plurality of discrete electrical contacts on a second surface thereof, each of the second plurality of discrete electrical contacts having an electrical connection portion and an electrically isolated portion comprising a portion facing the second surface of the adapter and a periphery defined thereabout, at least some of the second plurality of discrete electrical contacts in electrical communication with the first plurality of discrete electrical contacts; and a second plurality of conductive bumps, each extending from one of the second plurality of discrete electrical contacts.

8. The semiconductor device of claim 7, further comprising a protective coating over at least a portion of the die and at least a portion of the adapter, the plurality of conductive bumps being at least partially exposed through the protective coating.

9. The semiconductor device of claim 7, wherein the adapter comprises a material having a coefficient of thermal expansion substantially matching a coefficient of thermal expansion of the die.

10. The semiconductor device of claim 7, wherein the adapter comprises at least one conductive via extending between at least one of the first plurality of discrete electrical contacts and at least one of the at least some other of the second plurality of discrete electrical contacts.

11. The semiconductor device of claim 10, wherein at least one of the second plurality of discrete electrical contacts is electrically isolated from the plurality of bond pads disposed on the first surface of the die.

12. The semiconductor device of claim 7, further comprising a layer of adhesive between the adapter and the die.

13. A semiconductor device, comprising:

a die including a plurality of bond pads disposed on a first surface thereof;

an adapter adhesively secured to the die, the adapter having a first plurality of discrete electrical contacts on a first surface thereof, each electrically connected to one of the plurality of bond pads, and a second plurality of discrete electrical contacts on a second surface thereof, at least some of the second plurality of discrete electrical contacts being horizontally remote from at least some of the plurality of bond pads disposed on the first surface of the die, the at least some of the second plurality of discrete electrical contacts having an electrically isolated portion comprising a portion facing the second surface of the adapter and a periphery defined thereabout, and at least some other of the second plurality of discrete electrical contacts being electrically connected to the first plurality of discrete electrical contacts.

14. The semiconductor device of claim 13, wherein the adapter further comprises a sheet-like, nonconductive structure and wherein the first plurality of discrete electrical contacts is disposed on a first surface of the sheet-like, nonconductive structure and, wherein the second plurality of discrete electrical contacts is disposed on a second, opposing surface of the sheet-like, nonconductive structure.

15. The semiconductor device of claim 14, further comprising a plurality of conductive vias extending through the adapter electrically connecting the first plurality of discrete electrical contacts and the at least some other of the second plurality of discrete electrical contacts.

16. The semiconductor device of claim 13, wherein the adapter comprises a tape-like structure.

17. The semiconductor device of claim 13, wherein at least one of the second plurality of discrete electrical contacts is electrically interconnected with a second die.

\* \* \* \* \*